(12) United States Patent
Hariharan et al.

(10) Patent No.: US 7,124,314 B2
(45) Date of Patent: Oct. 17, 2006

(54) METHOD AND APPARATUS FOR FINE TUNING CLOCK SIGNALS OF AN INTEGRATED CIRCUIT

(75) Inventors: Suresh Hariharan, Austin, TX (US); Stanley Ho, Austin, TX (US); James R. Lundberg, Austin, TX (US)

(73) Assignee: IP-First, LLC, Fremont, CA (US)

( * ) Notice: Subject to any disclaimer, the term of this patent is extended or adjusted under 35 U.S.C. 154(b) by 475 days.

(21) Appl. No.: 10/682,352

(22) Filed: Oct. 9, 2003

(65) Prior Publication Data

US 2004/0085109 A1 May 6, 2004

Related U.S. Application Data

(60) Provisional application No. 60/424,115, filed on Nov. 5, 2002.

(51) Int. Cl.
 *G06F 1/04* (2006.01)
 *H03L 7/00* (2006.01)
(52) U.S. Cl. .................. 713/500; 713/600; 327/141
(58) Field of Classification Search ................ 713/500, 713/600; 327/141, 165
 See application file for complete search history.

(56) References Cited

U.S. PATENT DOCUMENTS

| | | | |
|---|---|---|---|
| 5,087,829 A * | 2/1992 | Ishibashi et al. ............ 327/152 |
| 5,239,206 A | 8/1993 | Yanai | |
| 5,570,045 A * | 10/1996 | Erdal et al. .................... 326/93 |
| 5,774,699 A * | 6/1998 | Nagae ........................ 713/400 |
| 5,809,034 A | 9/1998 | Rezvani et al. | |
| 5,852,640 A * | 12/1998 | Kliza et al. .................. 375/356 |
| 6,081,142 A * | 6/2000 | Douchi et al. .............. 327/158 |
| 6,114,890 A * | 9/2000 | Okajima et al. ............ 327/170 |
| 6,192,092 B1 | 2/2001 | Dizon et al. | |
| 6,215,345 B1 * | 4/2001 | Yashiba et al. ............. 327/279 |
| 6,289,068 B1 | 9/2001 | Hassoun et al. | |
| 6,647,081 B1 | 11/2003 | Butler et al. | |
| 6,903,582 B1 * | 6/2005 | Gaskins et al. ............. 327/141 |
| 6,959,396 B1 * | 10/2005 | Chen et al. ................... 713/50 |
| 2003/0026355 A1 * | 2/2003 | Thiele ........................ 375/316 |

FOREIGN PATENT DOCUMENTS

JP 2002-243821 * 8/2002

* cited by examiner

*Primary Examiner*—Chun Cao
(74) *Attorney, Agent, or Firm*—Gary R. Stanford; Richard K. Huffman; James W. Huffman

(57) ABSTRACT

An IC including skew-programmable clock buffers, fixed skew logic circuit, an external interface and a skew controller. Each skew-programmable clock buffer receives a distributed clock signal and provides a corresponding local clock signal having a programmed skew. The fixed logic circuit enables permanent programming of static skew values and the external interface enables programming of dynamic skew values. The skew controller selects between the static and dynamic skew values and programs the skew-programmable clock buffers based on selected skew values. In one embodiment, the skew controller is operative to detect a skew over-ride command upon reset of the IC and to select between the static and dynamic skew values based on the skew over-ride command. The programmable memory may be integrated on the IC or externally coupled via the external interface. The fixed skew logic circuit is implemented as any type of permanent programmable block, such as laser-blown fuses, an EPROM, etc.

26 Claims, 4 Drawing Sheets

METHOD AND APPARATUS FOR FINE TUNING CLOCK SIGNALS OF AN INTEGRATED CIRCUIT

CROSS-REFERENCE TO RELATED APPLICATIONS

This application claims the benefit of U.S. Provisional Application No. 60/424115, filed on Nov. 5, 2002, which is herein incorporated by reference for all intents and purposes.

This application is related to the following U.S. patent application Ser. No. 10/682,351, entitled "INTEGRATED CIRCUIT TIMING DEBUG APPARATUS AND METHOD," filed on Oct. 9, 2003. The aforementioned application is now issued as U.S. Pat. No. 6,903,582.

BACKGROUND OF THE INVENTION

1. Field of the Invention

The present invention relates to clocking of sequential logic blocks on an integrated circuit, and more particularly to a method and apparatus for fine tuning and permanently programming clock skews of clock signals after identifying and analyzing critical timing paths during test and debug.

2. Description of the Related Art

Integrated circuit designers have employed simulation and/or test to identify, isolate, and analyze timing problems on a chip, which often resulted in a chip design that at best could not perform at target clock speeds and that at worst had to be modified prior to mass fabrication. Typically, register logic within each logic block of the chip is employed to transmit/receive data to/from a succeeding/preceding logic stage. Setup time problems occur when a given logic block exhibits a critical delay path with regard to operations performed within to the extent that, at a given clock speed, valid data is not provided to the next logic stage until after a clock edge occurs at the next logic stage that is intended to latch the data. A hold time problem is exhibited by a logic chain when the given logic block provides valid data to the next logic block but the data becomes invalid prior to a clock edge occurring at the next logic block that is intended to latch the data. In the first case, the latching clock edge at the next logic stage occurs too soon for the transfer of valid data. In the second case, the latching clock edge at the next logic stage occurs too late for the transfer of valid data.

FIG. 1A is a simplified block diagram showing a circuit 100 with two representative successive logic blocks 101 and 103 to which clock signals are provided. The first logic block 101 (LOGIC BLOCK 1) receives a first clock signal ELCK1 and provides data signals DATA to the second logic block 103 (LOGIC BLOCK 2), which receives a second clock signal ECLK2. FIG. 1B is a timing diagram illustrating operation of the circuit 100 for synchronized versus skewed clock signals. The timing diagram generally shows traces of the ELCK1, ECLK2 and DATA signals versus time. Particular time points are shown, including times T1, T2, T3, T4 and T5 occurring in sequential order in which time T1 occurs first and time T5 occurs last.

The first two traces of the timing diagram show the case when the ECLK1 and ECLK2 clock signals are synchronized illustrating a setup time problem. As shown, for example, the ECLK1 and ECLK2 signals have synchronous edges including substantially coincident falling edges at time T1 and substantially coincident rising edges at time T3. The third trace shows the relative timing of the DATA signals from the first logic block 101 in which the data switches and becomes valid at a time T4, which is after time T3. The synchronized clock case illustrates a setup time problem in which the first logic block 101 exhibits a critical delay path such that valid data on the DATA signals at time T4 is not provided to the logic block 103 until after the rising clock edge at time T3 occurs. Because there is more work delay in the logic block 101 than there is time in a clock cycle, upon the rising edge of ECLK2 at time T3, invalid data is clocked into the logic block 103.

The fourth and fifth traces of the timing diagram show the case when the ECL2 signal is skewed relative to the ECLK1 signal. In particular, the fourth trace is a trace of the ECLK1 signal substantially similar to the first trace of ECLK1. The fifth trace shows ECLK2 skewed relative to ECLK1 where the falling edge of ECLK2 occurs at time T2 after time T1 and the subsequent rising edge of ECLK2 occurs at a time T5 after the time T4. The skewed clocks case illustrates that by delaying ECLK2 relative to ECLK1, the setup time problem is eliminated. In particular, the rising edge of ECLK2 is delayed until after the DATA signals become valid, thus allowing a valid transfer of data from the first logic block 101 to the second logic block 103.

Designers have heretofore provided hardwired logic to skew the clocks that are provided to sequential logic blocks to solve critical path and hold time problems. Such solutions, once implemented however, provided a permanent clock skew fix that could not be changed without modifying the chip design. Also, with reference to the illustrated example, one of ordinary skill in the art will appreciate that ECLK2 can be delayed only in the event that there is delay margin associated with the second logic block 103. An alternative solution is to advance the clock for latching incoming data into the preceding logic block (e.g., logic block 101) so that more time is provided for the stage to perform its work. This alternative solution is not always feasible, however, and may result in new and unforeseen timing problems.

As a matter of practice, designers analyze and simulate complex logic paths in an integrated circuit prior to committing a design to production. But one skilled in the art will appreciate that slight differences in clock skew cannot be simulated with sufficient accuracy and production process variations furthermore cannot be precisely modeled. Hence, most fabricated integrated circuits often exhibit a number of unanticipated critical timing paths that designers are forced to address prior to shipment. Consequently, any setup time problems that occur after-the-fact (i.e., after the chip is fabricated and permanent clock skews have been set) can only be eliminated by slowing down the clock speed of the device. Worse yet, after-the-fact hold time problems render a design totally inoperative. In either case, significant design modifications (often including changes to masks, electron beam analysis, etc.) are required to fix these types of problems.s

SUMMARY OF THE INVENTION

An integrated circuit (IC) according to an embodiment of the present invention includes skew-programmable clock buffers, fixed skew logic circuit, an external interface and a skew controller. Each skew-programmable clock buffer receives a distributed clock signal and provides a corresponding local clock signal having a programmed skew. The fixed skew logic circuit enables permanent programming of static skew values and the external interface enables programming of dynamic skew values. The skew controller selects between the static and dynamic skew values and programs the skew-programmable clock buffers based on selected skew values.

In one embodiment, the skew controller is operative to detect a skew over-ride command upon reset of the IC and to select between the static and dynamic skew values based on the skew over-ride command. The programmable memory may be integrated on the IC or externally coupled via the external interface. The fixed skew logic circuit is implemented as any type of permanent programmable block, such as laser-blown fuses, an EPROM, etc.

A method of tuning clock skews for an IC according to an embodiment of the present invention includes determining, by the IC upon reset, whether a skew over-ride command is provided, selecting skew values from fixed skew logic circuit integrated on the IC if the skew over-ride command is not provided, selecting skew values from a skew memory if the skew over-ride command is provided, programming at least one programmable delay block integrated on the IC based on selected skew values, and receiving, by each delay block, a distributed clock signal and providing at least one local clock signal having a skew based on a selected skew value.

The method may include integrating the skew memory as a dynamic memory on the IC and programming the skew memory via an external interface. The method may further include programming a skew over-ride bit on the IC and reading the skew over-ride bit upon reset of the IC. The method may further include holding the IC in reset while programming the skew memory and the skew over-ride bit. The method may further include testing the IC programmed with the dynamic skew values, repeating the programming and testing to determine an optimum set of skew values, and programming the fixed skew logic circuit with the optimum set of skew values.

A system for fine tuning clock signals of an IC according to an embodiment of the present invention includes a permanent programmable block for permanently programming at least one fixed skew value, programmable logic circuit for storing at least one dynamic skew value, at least one clock buffer, and a skew controller that selects between the fixed skew value and the dynamic skew value and that programs the clock buffer using the selected skew value. Each clock buffer includes programmable delay logic that delays a clock signal based on a selected skew value.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventors of the present application have recognized the need for providing designers an apparatus and method for dynamically controlling the skew of local clocks on an integrated circuit (IC) during test or debug and for programming optimum clock skews into a fabricated device. They have therefore developed a method and apparatus for fine tuning clock signals on a fabricated device and for permanently establishing optimized clock skews to maximize speed and to compensate for unanticipated problems after-the-fact, as will be further described below with respect to FIGS. 2–4.

The present invention provides an apparatus and method for dynamically controlling the skew of local clocks on an integrated circuit (IC) during test/debug and for programming optimum clock skews into a fabricated device. In the absence of programmed skews, upon power up the device utilizes clock skews that have been programmed into the chip itself via a fixed skew logic block, such as fuses or an EPROM (Electrically Programmable Read-only Memory) or the like. Clock skews for test are stored in a skew memory, and a skew controller integrated on the chip is directed to utilize the loaded skews upon reset. The skew memory may be a dynamic memory integrated on the chip, which is loaded via an external interface. The skew for each local clock can be delayed up to a maximum amount in predetermined increments. Once an optimal set of clock skews are determined, skew values are permanently stored on chip in the fixed skew logic. By providing dynamically programmable local clock skew and means for permanently establishing optimized clock skews, the speed of a given part can be maximized and compensation can be provided for unanticipated problems after-the-fact, or after the part is fabricated. In this manner, the part can be optimized and otherwise inoperative parts can be rendered operative and optimized.

Figure 1A:
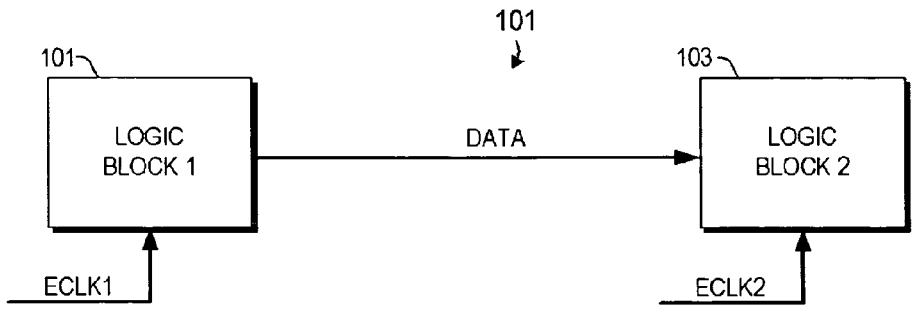
FIG. 1A is a simplified block diagram showing a circuit with two representative successive logic blocks and to which corresponding clock signals are provided.
Figure 1B:
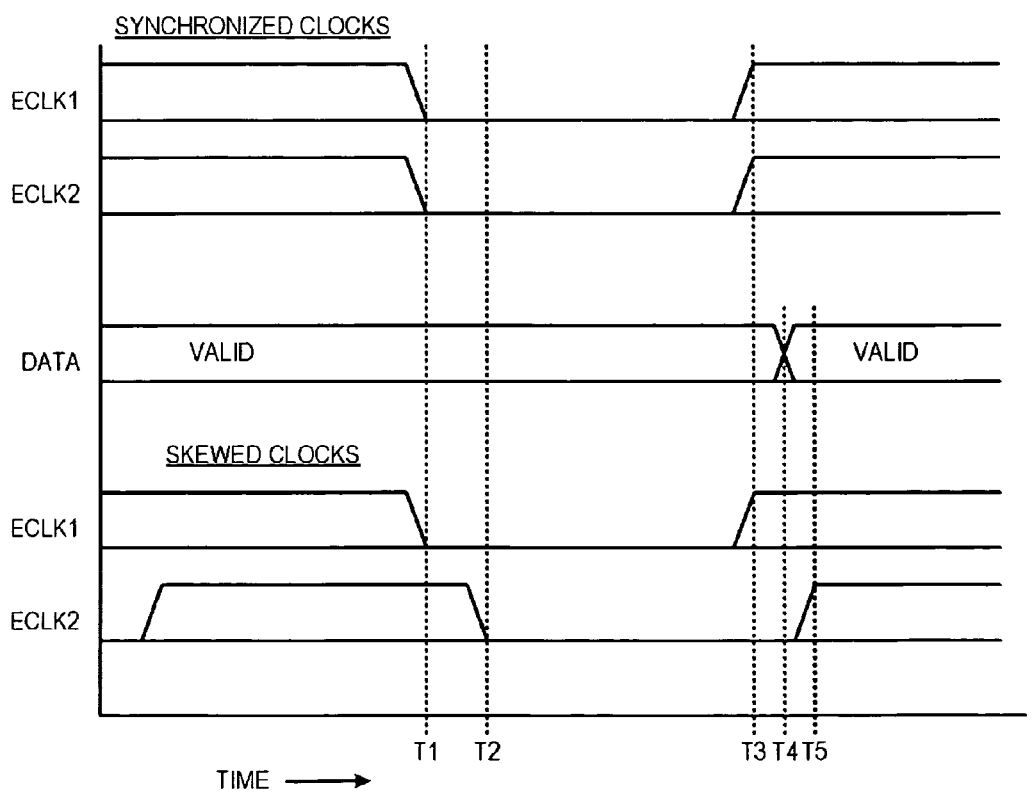
FIG. 1B is a timing diagram illustrating operation of the circuit of FIG. 1A for synchronized versus skewed clock signals.
Figure 2:
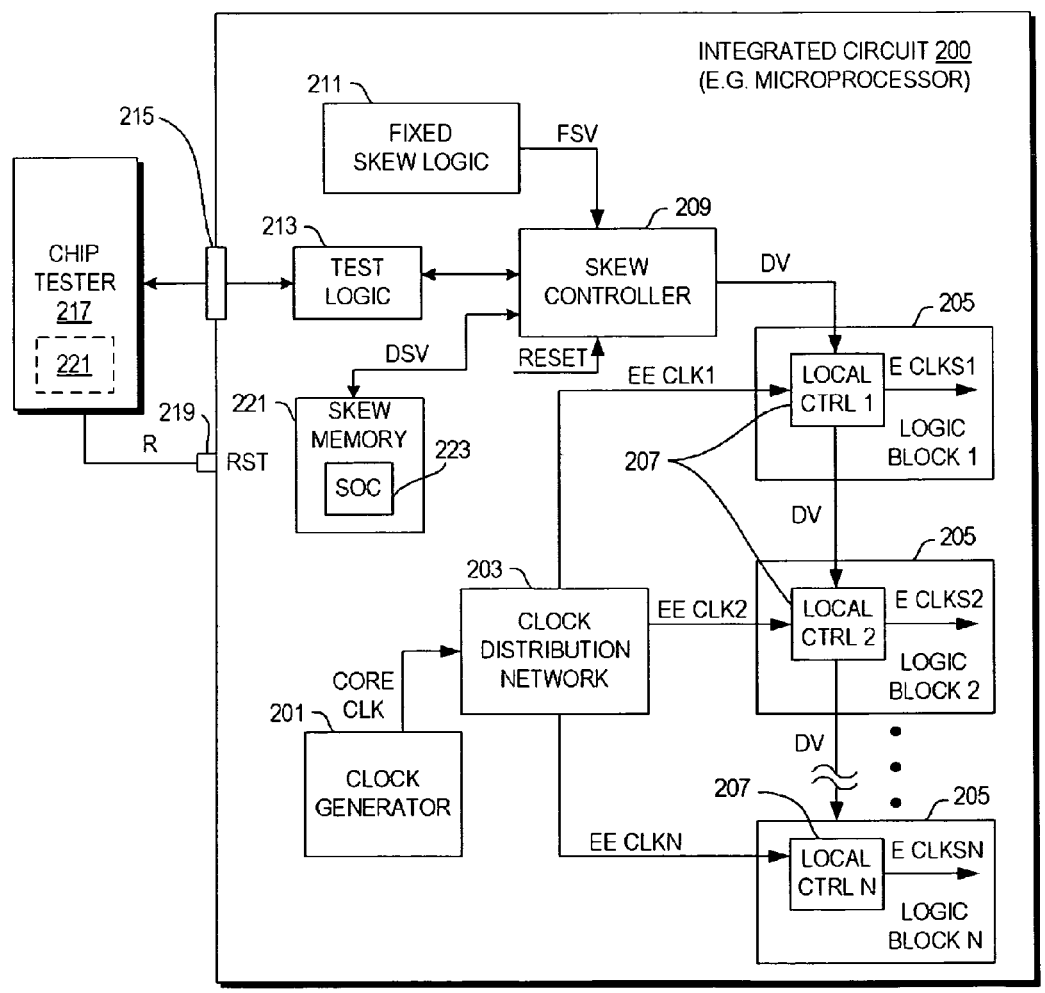
FIG. 2 is a block diagram of an integrated circuit incorporating a clock skew tuning system according to an exemplary embodiment of the present invention.

FIG. 2 is a block diagram of an integrated circuit (IC) 200 incorporating a clock skew tuning system according to an exemplary embodiment of the present invention. In the exemplary embodiment illustrated, the IC 200 is a microprocessor, although it is understood that the present invention applies to any type of circuitry or function fabricated onto a chip. As known to those of ordinary skill in the art, the IC 200 includes a clock generator 201 which provides a primary clock signal referred to as CORE CLK. The CORE CLK signal is provided to a clock distribution network 203, which provides multiple distributed copies or versions of the CORE CLK signal, individually shown as signals EE CLK1, EE CLK2, . . . , EE CLKN, where "N" is a positive integer. Each of the distributed EE CLKx signals (where "x" is an integer from 1 to N) is provided to a corresponding one of multiple logic blocks 205 incorporated onto the IC 200. The logic blocks 205 are individually shown as LOGIC BLOCK 1, LOGIC BLOCK 2, . . . , LOGIC BLOCK N, where any appropriate number "N" of the logic blocks 205 is contemplated depending upon the particular function integrated onto the IC 200. The logic blocks 205 generally represent the major logic blocks of the device implemented on the IC 200.

Each of the logic blocks 205 includes or is otherwise associated with a corresponding one of multiple local skew controllers 207, individually shown as LOCAL CTRL 1, LOCAL CTRL 2, ..., LOCAL CTRL N. Each of the local skew controllers 207 receives a corresponding one of the EE CLKx signals and provides a corresponding set of one or more local or "E level" clock signals referred to as E CLKSx, where each clock set is individually shown as E CLKS1, E CLKS2, ..., E CLKSN. Each E CLKSx represents a set of one or more local clock signals as further described below. The EE CLKx signals are generally synchronized (i.e., coincident edges), although respective timing may vary depending upon process variations and other physical factors, such as location of given CLKx signals on the chip, capacitive coupling, signal trace characteristics, etc. The local skew controllers 207 insert a programmed skew into each local clock signal of each E CLKSx set so that their relative timing depends upon the programmed skews.

The IC 200 includes a skew controller 209, which outputs one or more delay values (DV) on a DV signal line provided to each of the local skew controllers 207. In one embodiment, the delay values are provided in the form of a serial stream of binary encoded delay bits. The IC 200 also includes a fixed skew logic block 211, which outputs fixed skew values (FSV) to the skew controller 209 via one or more FSV signal lines. The IC 200 further includes test logic 213 coupled to the skew controller 209. The test logic 213 is externally accessible via an external test port 215 provided on the IC 200. The test port 215 may include any number of external pins of the IC as known to those skilled in the art. The external pins may be dedicated test pins or dual purpose pins as known to those of ordinary skill in the art. A chip tester 217 is coupled to the IC 200 via the test port 215, which provides a communication interface between the chip tester 217 and the test logic 213.

The test logic 213 and the test port 215 may be implemented according to the JTAG (Joint Test Action Group) in which the test logic 213 comprises JTAG logic. In a standard test configuration, the chip tester 217 includes a socket (not shown) or the like for receiving the IC 200. The chip tester 217 is able to control the external pins of the IC 200, including a reset (RST) pin via a signal R. In a typical JTAG configuration, for example, the chip tester 217 powers up the IC 200 and holds it in reset by asserting the R signal while configuring the IC 200 for test. During the test configuration while the IC 200 is held in reset, the chip tester 217 is able to access the test logic 213 via the test port 215, and set values or bits in selected registers or even load test data and/or routines for test and debug purposes. The chip tester 217 releases the R signal to pull the IC 200 out of reset, while the chip tester 217 monitors its operation.

In accordance with an embodiment of the present invention, the chip tester 217 holds the IC 200 in reset while loading dynamic clock skew values into a skew memory 221 coupled to the skew controller 209 via dynamic skew value (DSV) signal lines within the IC 200. The skew memory 221 may be implemented as any type of dynamic or volatile memory device, or any type of programmable logic that maintains its state while power is supplied to the IC 200. In the configuration shown, the test logic 213 enables external access to the skew memory 221 via the skew controller 209. It is appreciated, however, that if the skew memory 221 is integrated onto the IC 200, it may be located anywhere and may be coupled to enable external access in any convenient manner, such as provided within or otherwise directly coupled to the test logic 213. A RESET signal is shown provided to the skew controller 209, which holds it inactive while the IC 200 is held in reset. When the chip tester 217 releases the R signal to allow the IC 200 to come out of the reset condition, the skew controller 209 is configured to determine if a skew over-ride command is provided, and if so, to retrieve the dynamic skew values stored within the skew memory 221. The skew controller 209 uses the skew values to generate the delay values provided to program the local skew controllers 207 via the DV signal line. In this manner, a designer may program any skew into any skew-programmable local clock buffer on the IC 200 for purposes of test and/or debug.

Upon power up or reset and in the absence of direction from the test logic 213 (e.g., if the skew over-ride command is not provided), the skew controller 209 retrieves the fixed skew values from the fixed skew logic 211 for purposes of programming the local skew controllers 207. The fixed skew logic 211 is implemented in any suitable manner, such as multiple programmable fuses or an EPROM or any other type of permanent programmable block having the ability to retain its programmed state when power to the chip is removed. An initial configuration for fuses is that none of the fuses are blown, which results in zero skew delay for each local clock signal of each E CLKSx set. Alternatively, a portion of the fuses are blown to provide nominal skews. For an EPROM embodiment, the EPROM may be initially programmed with data, such as data associated with zero or nominal delays.

The skew controller 209 is configured, upon power up or reset, to determine whether the skew over-ride command is provided. If the skew over-ride command is not provided, the skew controller 209 selects the fixed skew values stored in the fixed skew logic 211, and if the skew over-ride command is provided, the skew controller 209 selects the dynamic skew values stored in the skew memory 221. In either case, the selected skew values are used to generate the delay values asserted on the DV signal line. Any suitable configuration for the skew values and the corresponding delay values is contemplated. In one embodiment, the skew values and delay values are the same, in which case the bits of the skew values are accessed in order and directly serially shifted out of the skew controller 209 onto the DV signal line.

The skew over-ride command may be implemented in any appropriate manner. As illustrated, for example, the skew over-ride command is programmed into the skew memory 221 as one or more skew over-ride command (SOC) bit(s) 223. In this case, the skew controller 209 is configured to read the SOC bit 223 to determine the presence of dynamic skew values, and if so, to retrieve the dynamic skew values from the skew memory 221 rather than the static skew values from the fixed skew logic 211. Alternatively, the skew over-ride command may be asserted by the test logic 213 including a programmed SOC bit. The skew over-ride command may alternatively be implemented by an SOC bit located in any programmable register within the IC 200. A microprocessor chip, for example, includes several multi-purpose registers that may used for this purpose.

In yet another embodiment, the chip tester 217 asserts the skew over-ride command via the external test port 215 during the reset process. In this case, the skew controller 209 is configured to monitor the test port 215, either directly or via the test logic 213. In yet another embodiment, the skew memory 221 is provided on the chip tester 217, shown with dashed lines, rather than being integrated on the IC 200. This embodiment provides the benefit of minimizing memory on the IC 200, if desired, such as for chips incorporating relatively simple functions with limited space. In this off-chip configuration, when coming out of reset, the skew controller 209 is configured to retrieve the dynamic skew values from the test logic 213, which in turn retrieves them from the chip tester 217. The skew over-ride command or SOC bit may be implemented on-chip or off-chip as previously described.

By means of the chip tester 217, clock skews or delays for each local clock of each E CLKSx set may be programmed by the test logic 213 during test or debug. In this manner, a designer dynamically changes the local clock delays during testing of the IC 200 to identify critical timing paths, to analyze timing problems, and/or to determine an optimum set of local clock skews that maximize the speed of the IC 200 or that otherwise renders the IC 200 operative which would have otherwise been scrapped. After determination of an optimum set of local clock skews, the optimum skews are permanently programmed into the IC 200, such as programming (or re-programming) of the fixed skew logic 211. Thereafter, upon initialization (reset or power-up) of the IC 200, the skew controller 209 utilizes the optimal set of clock skews programmed into the fixed skew logic 211 to program the local skew controllers 207.

It is noted that depending upon the configuration of the fixed skew logic 211, it may be re-programmed again if desired to program a new set of skew delay values. Such re-programming may not be available for one-time programmable devices, such as laser-blown fuses. It is also appreciated that regardless of where the dynamic skew memory used for test and/or debug is located, when the chip tester 217 is disconnected, each time the IC 200 is powered up or reset, the skew controller 209 retrieves the fixed delays programmed into the fixed skew logic 211 and programs the local skew controllers 207 accordingly.

Figure 3:
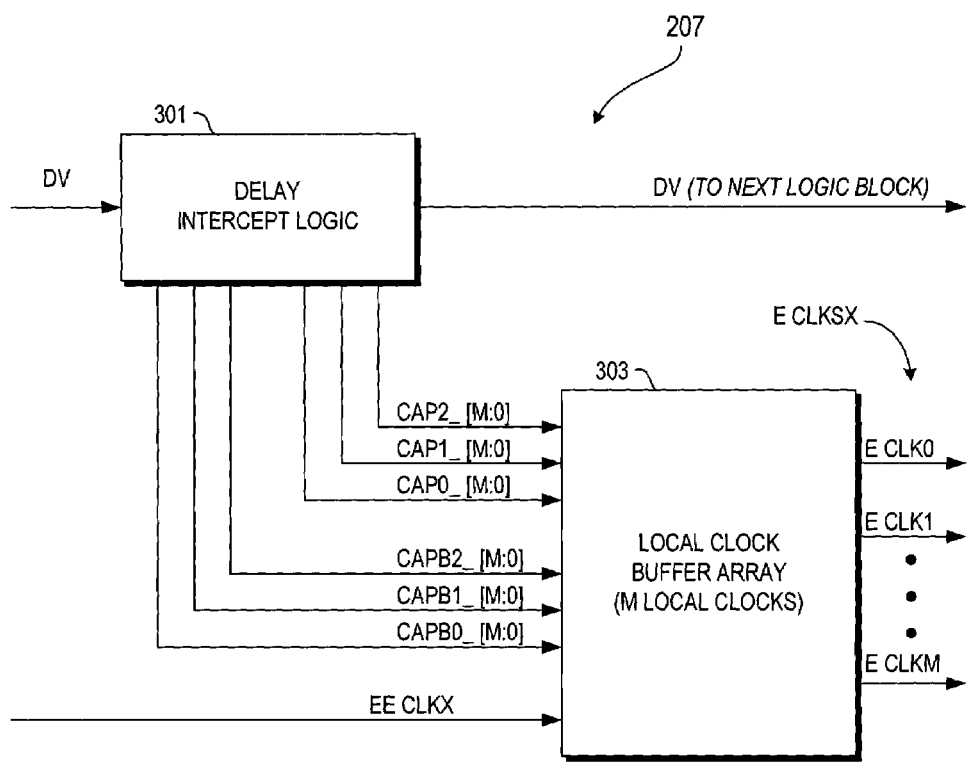
FIG. 3 is a more detailed block diagram of an exemplary embodiment of each of the local skew controllers of FIG. 2.

FIG. 3 is a more detailed block diagram of an exemplary embodiment of each of the local skew controllers 207. The DV signal line is provided to an input of delay intercept logic 301, where the DV signal line is also provided to any subsequent local skew controllers 207. The delay intercept logic 301 provides M sets of encoded delay bits to a local clock buffer array 303, which outputs M different local clock signals E CLK0, E CLK1, . . . , E CLKM. The number "M" is any suitable positive integer representing the number of local clock signals generated for the particular one of the local skew controllers 207.

In the embodiment shown, each set of encoded delay bits includes 3 true bits CAP0, CAP1 and CAP2 and a corresponding 3 complementary bits CAPB0, CAPB1 and CAPB2, where a "B" appended in the signal name denotes the logic complementary bit. As shown, the CAPi bits are grouped together (where i is an index integer from 0 to 2) and the CAPBi bits are also separately grouped together so that the delay intercept logic provides bit sets CAP2_[M:0], CAP1_[M:0], CAP0_[M:0] and complementary bit sets CAPB2_[M:0], CAPB1_[M:0], CAPB0_[M:0] to the local clock buffer array 303. A corresponding one of the EE CLKx signals is also provided to the local clock buffer array 303.

The DV signal may include any number of bits for conveying the delay values to the delay intercept logic 301 of each of the local skew controllers 207. In the exemplary embodiment shown, the DV signal is a single bit line and the skew controller 209 outputs a serial stream of binary encoded bit values including a delay value for each and every one of the local clock signals E CLKy, where (where "y" is an integer from 1 to M). In one embodiment, for example, if N=10 (i.e., 10 logic blocks 205) and if M is 5 for each of the local skew controllers 207, then there is a total of 50 local clock signals. If each delay value is 3 bits, then the skew controller 209 provides a serial bit stream of at least 150 bits to program each local clock signal. Each delay intercept logic 301 is configured to extract a corresponding 15 bits from the delay value stream, including 3 encoded bits for each of its 5 local clock signals. Each delay intercept logic 301 is further configured to output the extracted delay bits and their complements as the CAPi_[M:0] and CAPBi_[M:0] signals to its local clock buffer array 303. For the 3-bit example, a delay value of DV=001b (where an appended "b" denotes a binary number), then the delay bits includes a true set of delay bits 001b and a complementary set of delay bits 110b.

Figure 4:
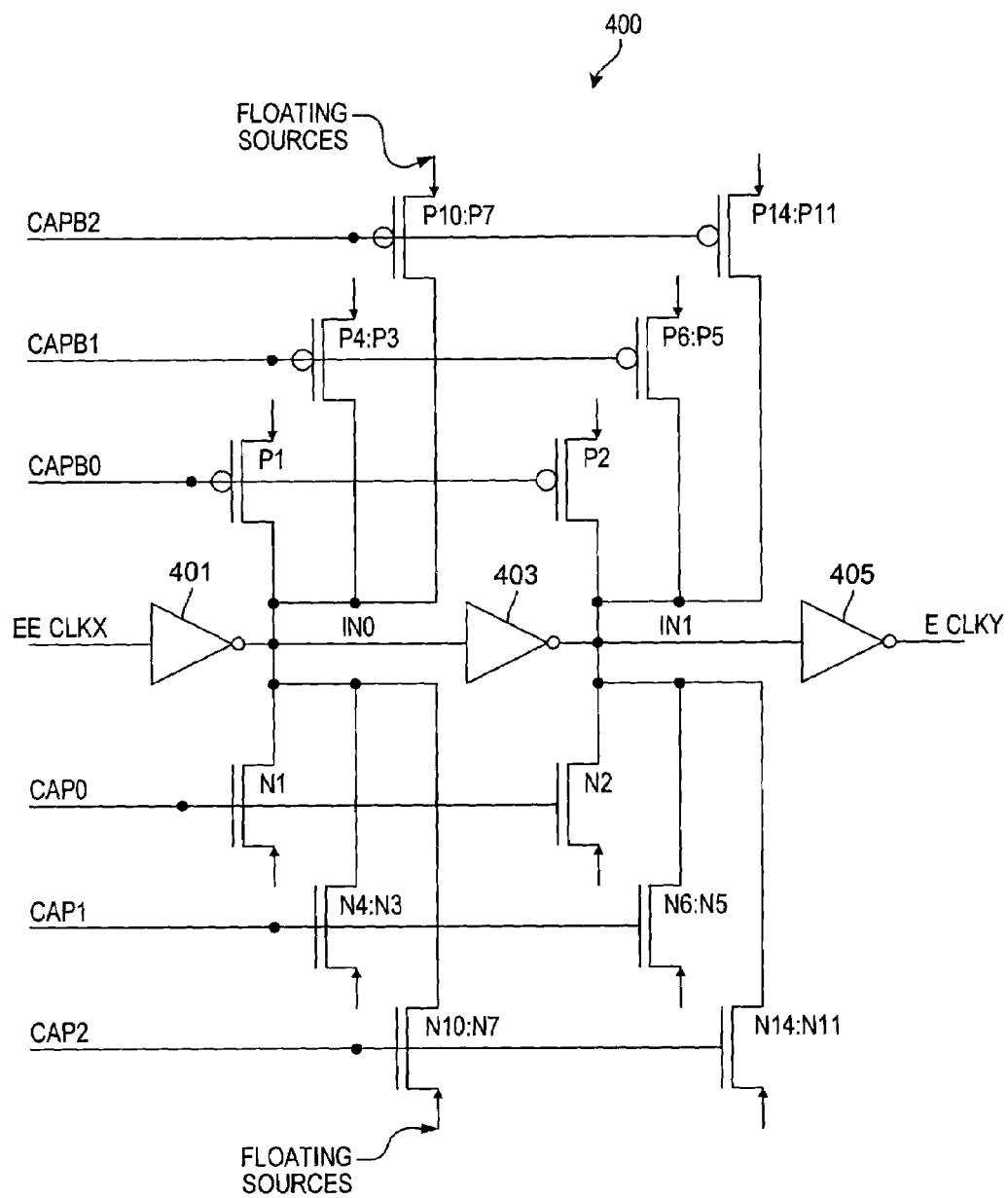
FIG. 4 is a schematic diagram of an exemplary embodiment of a local clock buffer that may be used within the local clock buffer array of FIG. 3 for each of the local clock signals.

FIG. 4 is a schematic diagram of an exemplary embodiment of a local clock buffer 400 that may be used within the local clock buffer array 303 for each of the local clock signals E CLKy. A representative EE CLKx signal is provided to the input of an inverter/buffer 401, which asserts a signal IN0 at its output to the input of another inverter/buffer 403. The inverter/buffer 403 asserts a signal IN1 at its output, which is coupled to the input of another inverter/buffer 405. The inverter/buffer 405 asserts a corresponding local clock signal E CLKy at its output. It is noted that the E CLKy signal is inverted relative to the corresponding EE CLKx signal given an odd number of inverters in the embodiment shown. An additional inverter/buffer (not shown) may be used to invert the clock signal again, or any of the inverter/buffers 401, 403, or 405 may be configured as a buffer if desired.

The CAP0 signal is provided to the gates of two N-channel devices N1 and N2 and the CAPB0 signal is provided to the gates of two P-channel devices P1 and P2. The CAP1 signal is provided to the gates of a pair of N-channel devices N3 and N4 (shown collectively as N4:N3) and to the gates of another pair of N-channel devices N5 and N6 (shown collectively as N6:N5). The CAPB1 signal is provided to the gates of a pair of P-channel devices P3 and P4 (shown collectively as P4:P3) and to the gates of another pair of P-channel devices P5 and P6 (shown collectively as P6:P5). The CAP2 signal is provided to the gates of an array of four N-channel devices N7, N8, N9 and N10 (shown collectively as N10:N7) and to the gates of another array of four N-channel devices N11, N12, N13 and N14 (shown collectively as N14:N11). The CAPB2 signal is provided to the gates of an array of four P-channel devices P7, P8, P9 and P10 (shown collectively as P10:P7) and to the gates of another array of four P-channel devices P11, P12, P13 and P14 (shown collectively as P14:P11).

The drains of the N-channel devices N1, N3, N4 and N7–N10 and drains of the P-channel devices P1, P3, P4 and P7–P10 are all coupled to the output of the inverter/buffer 401. The drains of the N-channel devices N2, N5, N6, and N11-N14 and drains of the P-channel devices P2, P5, P6, and P11–P14 are all coupled to the output of the inverter/buffer 403. The sources of all of the N-channel devices N1–N14 and the P-channel devices P1–P14 are floated (floating sources) so that the output of the inverter/buffers 401, 403 see the channel and source capacitances of each of the devices coupled thereto during signal transitions.

The exemplary local clock buffer 400 is implemented using sequentially-coupled buffers with one or more intermediate nodes, and binarily-distributed N-channel and P-channel arrays coupled to one or more of the intermediate nodes to effectuate a digitally controlled skew. In particular, the N-channel devices N1, N4:N3 and N10:N7 form a binarily-distributed N-channel array and the P-channel devices P1, P4:P3 and P10:P7 form a corresponding complementary and binarily-distributed P-channel array. In a similar manner, the N-channel devices N2, N6:N5 and N14:N11 form another binarily-distributed N-channel array and the P-channel devices P2, P6:P5 and P14:P11 form another corresponding complementary and binarily-distributed P-channel array. In the embodiment shown, two stages of delay are provided from the EE CLKx signal to the E CLKy signal to compensate for different turn on and turn off characteristics of P- and N-channel devices. For example, the N-channel device turn off characteristics in the second stage (IN0 to IN1) compensate for the P-device turn on characteristics in the first stage (EE CLKx to IN0). The particular configuration of each of the clock buffers is exemplary only and any other type of digitally programmable delay logic known to those of skill in the art is contemplated.

The CAP0/CAPB0 signals control one set of N- and P-channel devices (N1/P1 and N2/P2), the CAP1/CAPB1 signals control two arrayed sets of like N and P devices (N4:N3/P4:P3 and N6:N5/P6:P5), and the CAP2/CAPB2 signals control four arrayed sets of N and P devices (N10:N7/P10:P7 and N14:N11/P14:P11). In this manner, asserting the CAP2 signal results in a delay of the EE CLKx signal that is four times that exhibited by asserting the CAP0 signal. Each of the P- and N-channel device pairs are matched to provide substantially the same resistive/capacitive (RC) characteristics, resulting in a relatively constant delay increment for each asserted step of the 3-bit encoded signal. In one embodiment, each delay increment is approximately 6 picoseconds (ps). Thus, when the CAP0 signal is asserted high (logic 1) while the CAPB0 signal is asserted low (logic 0), a 6 ps delay is added between the input EE CLKx signal and the output E CLKy signal. In a similar manner, when the CAP1 signal is asserted high while the CAPB1 signal is asserted low, a 12 ps delay is added, and when the CAP2 signal is asserted high while the CAPB2 signal is asserted low, a 24 ps delay is added. For example, a value of CAP2:CAP0=011b equates to an overall clock delay of approximately 18 ps through the local clock buffer 400. In summary, a delay from 0 to 40 ps may be added in 6 ps increments using the 3-bit encoded delay CAP2:CAP0 signals. One skilled in the art will appreciate that asserting the CAPx and CAPBx signals results in delay as has heretofore been described due to the formation of channel-to-gate capacitances that are seen by the gates of corresponding devices when their associated CAPx and CAPBx signals are asserted. For example, an N-channel device sees a channel-to-gate capacitance because, when its gate is high, an inversion channel forms from its drain to its source, thus forming the channel-to-gate capacitance that is seen through the drain of the N-channel device. If the gate of the N-channel device is low, an inversion is not formed. For instance, in considering device N1 (neglecting parasitic capacitances), if CAP0 is high, signal IN0 sees the gate capacitance, source capacitance, and drain capacitance of N1. But if CAP0 is low, then signal IN0 sees only the drain capacitance of N1. Delays similarly result from P-channel devices configured as shown in FIG. 4 when their corresponding CAPBx signals are asserted low.

One advantage of a clock skew tuning systems according to embodiments of the present invention is that the local clock skews of a fabricated part may be optimally determined during test of the part to maximize the clock speed of the part. Another advantage of the present invention is that a means is provided for debugging critical path problems and determining local clock skews that correct the critical path problems for parts that have heretofore been scrapped. A third advantage is that another technique is now provided for quantitatively measuring and compensating for the effects of process variations via simple JTAG analysis techniques as opposed to complex techniques (e.g. electron beam analysis) that would otherwise result in modifications to the layout of the chip. The determined local clock skews that render the part useful and/or optimize speed of the part may then be permanently programmed via any suitable permanent programming means provided on the chip, such as fuses or an EPROM or the like.

Although the present invention has been described in considerable detail with reference to certain preferred versions thereof, other versions and variations are possible and contemplated. For example, additional stages or additional levels of arrayed N-channel and P-channel devices may be provided to add further delay if desired. Moreover, although the present disclosure contemplates application to metal-oxide semiconductor (MOS) type devices, including complementary MOS devices and the like, such as, for example, NMOS and PMOS transistors, it may also be applied in a similar manner to analogous types of technologies and topologies, such as bipolar devices and the like.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

What is claimed is:

1. An integrated circuit (IC), comprising:
   a plurality of skew-programmable clock buffers, each receiving a distributed clock signal and providing a corresponding one of a plurality of local clock signals each having a programmed skew;
   fixed skew logic circuit that enables permanent programming of a plurality of static skew values;
   an external interface that enables programming of a plurality of dynamic skew values; and
   a skew controller, coupled to said external interface, to said plurality of skew-programmable clock buffers, and to said skew fixed logic circuit, that selects between said dynamic skew values and said static skew values and that programs each of said plurality of skew-programmable clock buffers based on selected skew values.

2. The IC of claim 1, wherein said skew controller is operative to detect a skew over-ride command upon reset of the IC, to select said dynamic skew values programmed into a programmable memory if said skew over-ride command is detected, and to select said plurality of static skew values if said skew over-ride command is not detected.

3. The IC of claim 2, wherein said programmable memory is integrated on the IC.

4. The IC of claim 2, wherein said programmable memory is externally coupled via said external interface.

5. The IC of claim 1, wherein said skew controller outputs a serial stream of binary encoded bits.

6. The IC of claim 5, wherein each of said plurality of skew-programmable clock buffers comprises:
   delay intercept logic circuit, coupled to said skew controller, that intercepts selected ones of said binary encoded bits and that outputs at least one corresponding set of delay bits; and at least one local clock buffer, each said local clock buffer receiving said distributed clock signal and a corresponding set of delay bits and providing a corresponding one of said plurality of local clock signals having a skew determined by said corresponding set of delay bits.

7. The IC of claim 6, wherein each said local clock buffer comprises:
a plurality of sequentially-coupled buffers having an input receiving said distributed clock signal, at least one intermediate node, and an output providing a corresponding one of said plurality of local clock signals; and
at least one array of P-channel and N-channel devices, each said array having a plurality of inputs receiving said corresponding set of delay bits and at least one output coupled to said at least one intermediate node.

8. The IC of claim 7, wherein each said array of P-channel and N-channel devices comprises an N-channel array including a plurality of binarily-distributed N-channel devices with floating sources having inputs receiving true encoded delay bits from said corresponding set of delay bits and having an output coupled to said intermediate node, and a P-channel array including a plurality of binarily-distributed P-channel devices with floating sources having a plurality of inputs receiving complementary encoded delay bits from said corresponding set of delay bits and having an output coupled to said intermediate node.

9. The IC of claim 1, wherein said fixed skew logic circuit comprises a plurality of fuses.

10. The IC of claim 1, wherein said a fixed skew logic circuit comprises an electrically programmable read-only memory.

11. A method of tuning clock skews for an integrated circuit (IC), comprising:
determining, by the IC upon reset, whether a skew over-ride command is provided;
selecting skew values from a fixed skew logic circuit integrated on the IC if the skew over-ride command is not provided;
selecting skew values from a skew memory if the skew over-ride command is provided;
programming at least one programmable delay block integrated on the IC based on selected skew values; and
receiving, by each delay block, a distributed clock signal and providing at least one local clock signal having a skew based on a selected skew value.

12. The method of claim 11, wherein said programming at least one programmable delay block comprises:
providing a serial stream of binary encoded delay bits;
intercepting the serial stream and selecting corresponding ones of the binary encoded delay bits; and
providing selected true and complementary binary encoded delay bits.

13. The method of claim 12, further comprising:
providing selected true binary encoded delay bits to gates of at least one binarily-distributed array of N-channel devices with floating sources integrated on the IC;
providing selected complementary binary encoded delay bits to gates of at least one binarily-distributed array of P-channel devices with floating sources integrated on the IC; and
delaying a distributed clock signal through a plurality of sequentially-coupled clock buffers coupled to corresponding arrays of N-channel and P-channel devices.

14. The method of claim 11, further comprising:
integrating the skew memory as a dynamic memory on the IC; and
programming the skew memory via an external interface.

15. The method of claim 14, further comprising:
programming a skew over-ride bit in the skew memory; and
said determining whether a skew over-ride command is provided comprising reading the skew over-ride bit.

16. The method of claim 15, further comprising holding the IC in reset during said programming the skew memory and said programming a skew over-ride bit.

17. The method of claim 11, wherein said selecting skew values from the skew memory comprises reading the skew memory coupled to the IC via an external interface.

18. The method of claim 17, wherein said determining whether a skew over-ride command is provided comprises monitoring the external interface.

19. The method of claim 11, further comprising:
programming the skew memory with dynamic skew values and providing the skew over-ride command during reset of the IC;
testing the IC programmed with the dynamic skew values;
repeating said programming and testing to determine an optimum set of skew values; and
programming the fixed skew logic circuit with the optimum set of skew values.

20. The method of claim 19, wherein said programming the fixed skew logic circuit comprises blowing at least one fuse integrated on the IC via laser.

21. The method of claim 19, wherein said programming the fixed skew logic circuit comprises programming an electrically programmable read-only memory integrated on the IC.

22. A system for fine tuning clock signals of an IC, comprising:
a permanent programmable block for permanently programming at least one fixed skew value;
logic programmable logic circuit for storing at least one dynamic skew value;
at least one clock buffer, each including programmable delay logic that delays a clock signal based on a selected skew value; and
a skew controller, coupled to said permanent programmable block, said programmable logic circuit and said at least one clock buffer, that selects between said at least one fixed skew value and said at least one dynamic skew value and that programs said at least one clock buffer using the selected skew value.

23. The system of claim 22, wherein said programmable logic circuit is incorporated on the IC and programmed via an external interface.

24. The system of claim 22, wherein said at least one clock buffer comprises at least one buffer coupled to an array of binarily-distributed N-channel devices and P-channel devices.

25. The system of claim 24, where said array comprises P-channel and N-channel device pairs that are matched to provide substantially the same resistive/capacitive characteristics.

26. The system of claim 22, wherein said skew controller reads at least one skew over-ride bit programmed on the IC to select between said at least one fixed skew value and said at least one dynamic skew value.

* * * * *